(12) United States Patent
Warwick

(10) Patent No.: US 6,448,581 B1
(45) Date of Patent: Sep. 10, 2002

(54) MITIGATION OF DELETERIOUS EFFECTS OF MICROPIPES IN SILICON CARBIDE DEVICES

(75) Inventor: Colin Alan Warwick, Holmdel, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/634,021

(22) Filed: Aug. 8, 2000

(51) Int. Cl.⁷ .......................................... H01L 31/0312
(52) U.S. Cl. ........................................ 257/77; 257/134
(58) Field of Search .......................... 117/106, 84, 95; 423/345; 257/27, 77, 124, 134, 192, 256, 272

(56) References Cited

U.S. PATENT DOCUMENTS

| | | | |
|---|---|---|---|
| 5,679,153 A | * 10/1997 | Dmitriev et al. | ............ 117/106 |
| 5,958,132 A | * 9/1999 | Takahashi et al. | ............ 117/84 |
| 6,187,279 B1 | * 2/2001 | Tanino et al. | ................ 423/345 |
| 6,214,108 B1 | * 4/2001 | Okamoto et al. | ............. 117/95 |

* cited by examiner

Primary Examiner—David Nelms
Assistant Examiner—Bau T Le

(57) ABSTRACT

The invention includes a semiconductor device, comprising a silicon carbide substrate comprising micropipes, wherein the micropipes are filled with a dielectric, and a method of making such a device.

7 Claims, 1 Drawing Sheet

MITIGATION OF DELETERIOUS EFFECTS OF MICROPIPES IN SILICON CARBIDE DEVICES

FIELD OF THE INVENTION

This invention relates to semiconductor devices made from silicon carbide.

BACKGROUND OF THE INVENTION

Silicon carbide (SiC) has a thermal conductivity three times that of silicon, a breakdown field ten times higher than silicon, and a saturated drift velocity twice that of silicon. This makes it suitable for certain high power or high voltage devices. However, state of the art SiC wafers have a finite density of micropipes (30 to 200 $cm^{-2}$). These micropipes cause yield problems when a device such a field effect transistor is located, or partially located, over a micropipe. See, for example, P. G. Neudeck and J. A. Powell, "Performance Limiting Micropipe Defects in Silicon Carbide Wafers." IEEE Electron Device Letters, Vol. 15, No. 2, pp. 63–65, (1994).

SUMMARY OF THE INVENTION

The invention includes a semiconductor device, comprising a silicon carbide substrate comprising micropipes, wherein the micropipes are filled with a dielectric, and a method of making such a device.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention mitigates the deleterious effect of these defects by, for example, plugging the pipes with an insulator dielectric such as a conformal film of silicon dioxide ($SiO_2$). The excess SiO2 on the topside of the substrate can then be removed by isotropic etching or planarization like chemical mechanical polishing (CMP). The wafers are then conventionally processed into MESFETs (metal semiconductor junction field effect transistors), LEDs (light emitting diodes) and the like.

Figure 1:
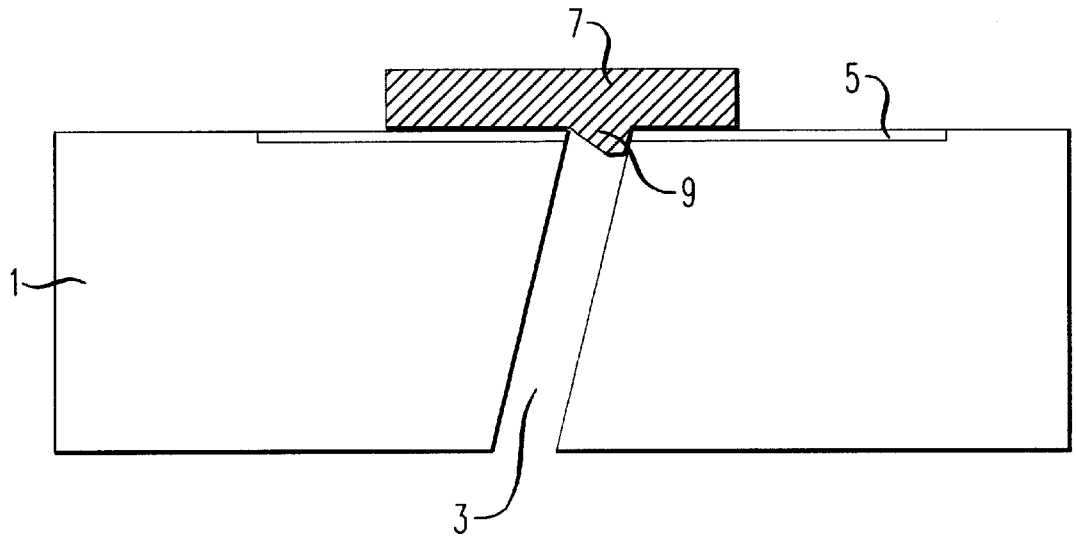
FIG. 1 is a cross-sectional view of a prior art silicon carbide substrate showing a micropipe defect.

Referring now to the drawing, wherein like reference numerals refer to like elements throughout, FIG. 1 is a cross-sectional view of a prior art silicon carbide substrate 1, comprising an exemplary micropipe 3. The wafer has proceeded through patterning and implantation of a MESFET channel 5. Metal MESFET gate 7 is then deposited. However, the presence of the micropipe allows some of the deposited metal 7 to form an undesirable short 9 from the gate 7 to the substrate 1.

Figure 2:
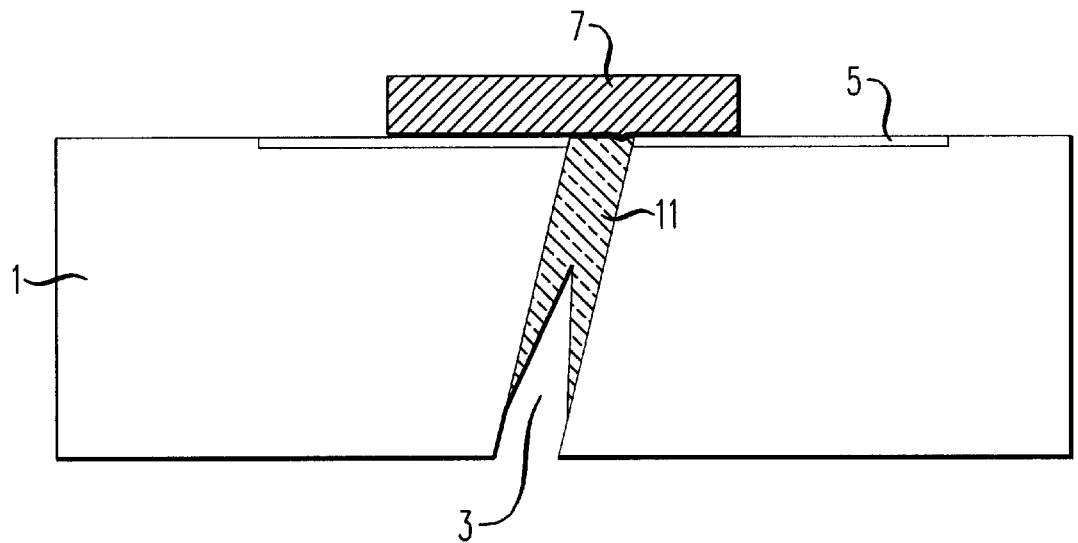
FIG. 2 is a cross-sectional view of a silicon carbide substrate showing a micropipe defect plugged with a dielectric, for one embodiment of the invention.

Turning now to one embodiment of the present invention illustrated in FIG. 2, a dielectric plug 11 is now filling the micropipe 3, preventing the metal gate 7 from shorting to the substrate 1. Note that the micropipe can only be partially filled to obtain this benefit. The dielectric plug 11 may be made from silicon nitride, silicon oxynitride or spin-on glass, for example. Silicon dioxide is particularly preferred. A preferred application technique is plasma enhanced chemical vapor deposition. In the case of silicon dioxide, the chemical vapor precursor is typically tetraethylorthosilicate. Deposition will normally fill not only the micropipes, but leave a dielectric layer on the surface as well (not shown). It is preferred that this layer be removed before proceeding in flow. Removal techniques include planarization by chemical-mechanical polishing, for example, and isotropic etching.

Although the invention has been described with reference to illustrative embodiments, it is not limited to those embodiments. Rather, the appended claims should be construed to include other variants and embodiments of the invention that may be made by those skilled in the art without departing from the true spirit and scope of the present invention.

What is claimed is:

1. A semiconductor device, comprising a silicon carbide substrate comprising micropipes, wherein at least one micropipe is at least partially filled with a material wherein the material is silicon dioxide, silicon nitride or silicon oxynitride.

2. The semiconductor device of claim 1, wherein the micropipes are 1 to 10 microns in diameter.

3. The semiconductor device of claim 1, further comprising a field effect transistor.

4. A method of making a semiconductor device, comprising depositing silicon dioxide on a silicon carbide substrate comprising micropipes to fill at least one micropipe at least partially with a material wherein the material is silicon dioxide, silicon nitride or silicon oxynitride.

5. The method of claim 4, wherein the micropipes are 1 to 10 microns in diameter.

6. The method of claim 4, wherein the deposition technique is plasma enhanced tetraethylorthosilicate.

7. The method of claim 4, further comprising the step of planarizing the dielectric after deposition.

* * * * *